United States Patent [19]

Schindler

[11] 4,205,259
[45] May 27, 1980

[54] HORIZONTAL DEFLECTION CIRCUIT FOR TELEVISION SYSTEMS

[75] Inventor: Bernd Schindler, Rastede, Fed. Rep. of Germany

[73] Assignee: Blaupunkt-Werke GmbH, Hildesheim, Fed. Rep. of Germany

[21] Appl. No.: 16,386

[22] Filed: Mar. 1, 1979

[30] Foreign Application Priority Data

Mar. 4, 1978 [DE] Fed. Rep. of Germany ....... 2809378

[51] Int. Cl.² .................. H01J 29/70; H01J 29/76
[52] U.S. Cl. .................................. 315/408; 358/243
[58] Field of Search .................. 315/408, 399; 358/243

[56] References Cited

U.S. PATENT DOCUMENTS 4,042,858 8/1977 Collette et al. ................. 315/408
4,042,859 8/1977 Kashiwagi ......................... 358/243

Primary Examiner—Theodore M. Blum
Attorney, Agent, or Firm—Frishauf, Holtz, Goodman & Woodward

[57] ABSTRACT

To protect the horizontal deflection circuit against reverse polarity high-voltage pulses derived from an inductance, which is provided to rapidly drain stored charge carriers of an output transistor thereof, a protective circuit is connected between the driver stage and the base of the output transistor which includes a transistor controlled by the driver stage, for example by a reverse polarity signal which renders the parallel connected transistor conductive, thereby short-circuiting the reverse polarity pulse with respect to the driver stage and protecting the driver stage thereagainst.

9 Claims, 1 Drawing Figure

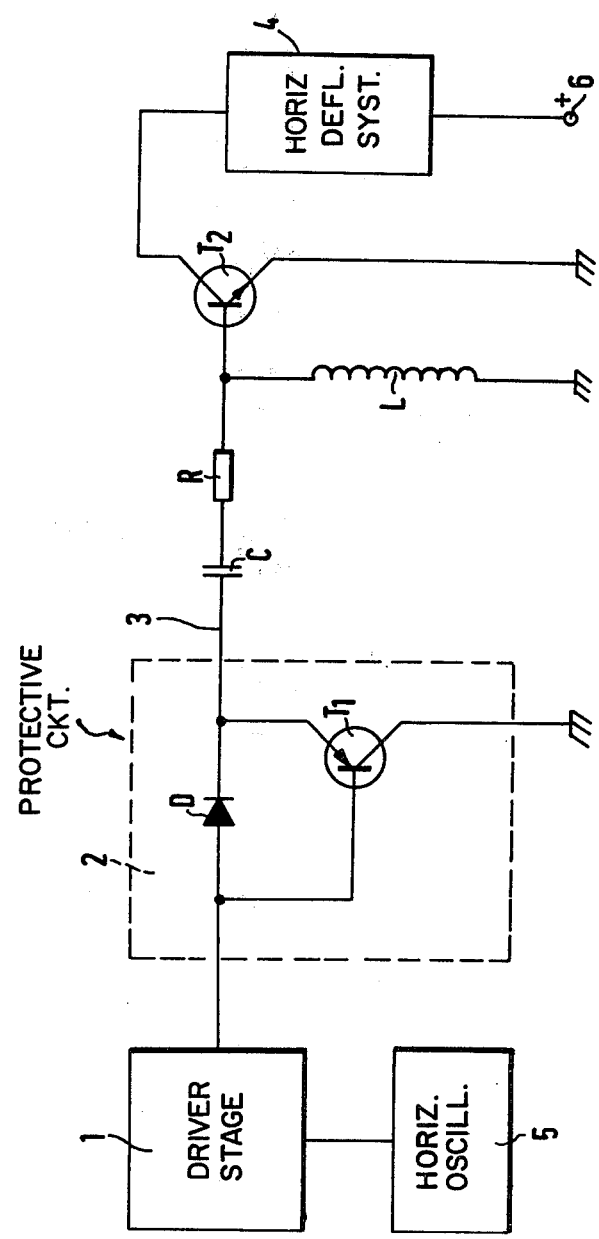

HORIZONTAL DEFLECTION CIRCUIT FOR TELEVISION SYSTEMS

The present invention relates to a horizontal deflection circuit for television systems, and more particularly to such a circuit in which a driver stage is directly coupled to an output transistor.

BACKGROUND AND PRIOR ART

Horizontal deflection circuits which are directly coupled have been proposed in which the final or output power transistor has a voltage of reverse polarity applied thereto so that it will turn OFF rapidly. This voltage usually is comparatively high with respect to the voltage being switched by the output transistor. The reason for applying a high reverse voltage to the transistor is this: The charge carriers which are stored in the base of the output transistor are thus rapidly drained and the losses in the final output transistor of the horizontal deflection circuit are thus substantially decreased.

Horizontal deflection circuits in which the final or output power transistor is directly driven from a driver stage have the disadvantage, however, that the high reverse voltage applied to the output transistor can damage and possibly destroy the driver stage.

The Invention

It is an object to protect the driver stage of a horizontal deflection circuit of the type in which the output transistor receives a reverse charge carrier drainage voltage, which is reliable, and operates essentially trouble-free.

Briefly, a separate protective circuit is provided which is operated during the blocking phase of the final output transistor and which effectively electrically separates the driver stage from the output transistor. In a preferred form, the protective circuit includes a transistor controlled by the driver stage itself which prevents application of the reverse polarity voltage pulse to the driver stage. In accordance with a particularly suitable arrangement, the driver stage is protected by short-circuiting the signal path from the driver stage to the final output transistor during the blocking phase of the output power transistor. Short-circuiting of the driver stage may be controlled by signals derived from the driver stage itself. In a preferred from, a transistor is used which is so controlled from the driver stage that it becomes conductive during application of the reverse voltage pulse to the final output stage, thereby short-circuiting the signal path to the driver stage.

Drawing, illustrating a preferred example, wherein the single FIGURE is a general, highly simplified block circuit diagram of the output portion of a horizontal deflection circuit for a television receiver.

A line or horizontal oscillator 5 is connected to a driver stage 1 to control the driver stage 1 with horizontal frequency pulses. The driver stage 1 controls conduction or cut-off of output transistor $T_2$. The collector portion of the output transistor $T_2$ is connected to the horizontal deflection system 4 of the TV image tube. A positive voltage is applied at terminal 6 to the horizontal deflection system, the other terminal of the positive voltage being connected to ground or chassis. The system 4 may be of any well known and suitable type and includes—as standard in the art—the horizontal deflection coils. associated correction elements and the like and, if desired by the designer, the primary coil of a horizontal output transformer. The horizontal oscillator 5 and the driver stage 1, itself, may be built in accordance with any well known or desired circuit.

The output transistor $T_2$ is an npn transistor. Pulses from the driver stage 1 are conducted to the base of the transistor $T_2$ over diode D and capacitor C. The diode is poled in conductive direction for the control pulses. A coupling resistor R is serially included in the circuit between the driver stage and the base of the transistor $T_2$. The voltage applied to the output transistor $T_2$ is also connected to an inductance coil L, in which current increases with increasing power applied to the base of transistor $T_2$. The blocking phase of the output transistor $T_2$ is initiated by applying a voltage from the driver stage 1 to the base of pnp transistor $T_1$ to render the transistor $T_1$ conductive. This voltage is effective during the OFF time of the output transistor $T_2$. The signal path between the protective circuit and the output transistor $T_2$ is thus short-circuited over the then conductive emitter-collector main switching path of the transistor $T_1$. The voltage which occurs at the output transistor $T_2$ and which would have held it conductive is then no longer present. A magnetic field which is stored in the inductance L rapidly collapses, providing a high reverse voltage pulse, in this case negative, to the base of the output transistor $T_2$. This reverse voltage, high voltage voltage pulse drains the charge carriers which are stored in the base of the output transistor $T_2$. The high reverse voltage which occurs in this initial OFF phase of the output transistor $T_2$ is also coupled through the resistor R and the capacitor C to the now conductive collector-emitter path of the transistor $T_1$. The current is limited by the resistor R. The driver stage 1 is thus isolated from voltage peaks due to the inductance L by the then conductive transistor $T_1$; the emitter-collector path of the transistor $T_1$ short-circuits such voltage peaks with respect to the driver stage 1, thus protecting the driver stage 1 against these peaks.

The combination formed by the resistor R and capacitor C forms a time constant circuit and is an additional protection; the time constant of the R/C circuit will delay the time at which the voltage peak due to the inductance L is applied to the transistor $T_1$. This ensures that the transistor $T_1$ is conductive when the voltage peak from the inductance L is applied thereto.

The capacitor C also effects a voltage shift so that the base of the output transistor $T_2$ can have a negative bias applied thereto in a suitable manner without loading the driver stage. Such a negative bias supports drainage of charge carriers from the base zone of the output transistor $T_2$ during its OFF or blocked phase.

The protective circuit 2 may be constructed in various ways, and the diode D can be replaced by a resistor over which the pulses which switch the output transistor $T_2$ are applied from the driver stage 1 to the base thereof.

The pulses which control the output power transistor $T_2$ and the transistor $T_1$ during the OFF or blocked phase of the power transistor $T_2$ can be connected in various ways; for example, the driver stage may have separate complementary outputs which are connected, respectively, to the base of the output transistor $T_2$ and to the base of the protective circuit transistor $T_1$, respectively.

The horizontal deflection circuit, protected against overvoltage, is simple and has high efficiency and reliability. The protective circuit and the driver stage can be constructed easily by using suitable integrated circuit technology.

The emitter-base diode of the protective transistor $T_1$ is in the signal path of the driver stage to the output power transistor $T_2$, the collector being grounded, as seen in the figure. The emitter-base diode of transistor $T_1$ is reversely polarized with respect to the diode D, so that the output pulses from the driver stage 1 which control transistor $T_2$ to be ON are conducted over the diode D, whereas the emitter-base diode of the protective transistor $T_1$ is rendered conductive by reverse polarity output pulses derived from the driver stage during the OFF or blocking phase of the output transistor $T_2$. The presence of the emitter-base diode portion of the transistor $T_1$ also permits the simplification of the circuit by replacing the diode D by a resistor, which then will bridge the emitter-base diode of the transistor $T_1$.

It is a specific advantage of the arrangement that the high reverse voltage which builds up during the OFF or blocking phase of the output transistor $T_2$ can be removed from application to the driver stage without substantial additional materials or costs. The signal path from the driver stage to the output transistor has the resistor R included therein across which the voltage will build up which controls the output transistor $T_2$ to conduction during the ON phase of the output stage while permitting application of a high reverse voltage pulse to the base of the transistor $T_2$ by connecting the inductance L between the resistor R and the base of the transistor $T_2$. The resistor thus has the multiple function of current limiting for the transistor $T_1$, forming a portion of the R/C time delay circuit which protects the driver stage when transistor $T_1$ is conductive and additionally limits the current flow through the emitter-collector main current carrying path of the transistor $T_1$. The protective circuit 2 can be readily integrated with the driver stage 1 in a single integrated circuit without substantial additional cost, and permits constructing the driver stage with elements of low voltage rating, thus decreasing the cost of the overall circuit, while providing reliable protection against reverse voltage peaks to the driver stage and still effecting rapid turn-off of the power output transistor $T_2$.

Various changes and modifications may be made and, particularly, the diode D can be replaced by a resistor.

In a typical television horizontal deflection circuit for a 27" diagonal TV tube, the inductance L is: 1 mH
resistor R: 22 Ohms
capacitor C: 2.2 μF resulting in a reverse voltage pulse at the base of transistor $T_2$ of $\leq 5$ volts which can readily be isolated from the driver stage 1 by an integrated circuit transistor $T_1$ of 1.8 A emitter-collector current carrying capacity.

I claim:

1. Horizontal deflection circuit for a television system having an output transistor ($T_2$);
a driver stage (1) connected to the base of the output transistor ($T_2$) to alternately control the transistor to conduction and blocking state;
means (L) providing a high-voltage pulse of reverse polarity to the base of the output transistor ($T_2$) to cause rapid change-over from conduction to blocking state thereof, and drain stored charge carriers, and comprising, in accordance with the invention,
a protective circuit (2) to protect the driver stage against the reverse high-voltage pulse including controlled switch means ($T_1$) controlled by the driver stage (1) and preventing application of said reverse polarity high-voltage pulse to the driver stage.

2. Circuit according to claim 1, wherein said controlled switch means ($T_1$) comprises a controlled semiconductor switch which is connected to short-circuit the signal path (3) from the driver stage (1) to the output transistor ($T_2$) during the time that the output transistor is in blocking state to thereby prevent application of said high-voltage pulse to the driver stage.

3. Circuit according to claim 2, wherein the controlled switch means comprises a transistor ($T_1$) and connection means from the driver stage (1) to the base of said transistor to render said transistor conductive and hence short-circuit the signal path (3) from the driver stage (1) to the output transistor ($T_2$).

4. Circuit according to claim 3, wherein the controlled switch means transistor ($T_1$) has its emitter-base diode connected to the signal path (3) between the driver stage (1) and the base of the output transistor ($T_2$);
the collector of the controlled switch means transistor (1) being connected to reference or ground potential;
and a diode (D) is connected in parallel to said emitter-base diode and reversely poled with respect thereto, the polarity of said diode transferring the output signals from the driver stage (1) to the output transistor ($T_2$) in conductive direction, and the driver stage (1) provides output pulses to the controlled switch means transistor ($T_1$) of a polarity reverse to that of the signals controlling the output transistor to render said controlled switch means transistor ($T_1$) conductive during the blocking phase of the output transistor ($T_2$).

5. Circuit according to claim 3, wherein the controlled switch means transistor ($T_1$) has its emitter-base diode connected in the signal path from the driver stage (1) to the output transistor ($T_2$);
a resistance means (D) is connected in parallel to said emitter-base diode;
the collector of the controlled switch means transistor ($T_1$) being connected to ground or reference voltage;
and the driver stage (1) provides output signals of respectively reverse polarity, the output signals of one polarity being transferred from the driver stage (1) through said resistance means (D) to the base of the output transistor ($T_2$) and having a polarity which will block the emitter-base diode of said controlled switch means transistor and, during the blocking phase of the output transistor, the driver stage provides output signals of a polarity which will render the emitter-base diode of said controlled switch means transistor ($T_1$) conductive to thereby render said controlled switch means transistor ($T_1$) conductive and prevent application of the high-voltage reverse polarity pulse from said high-voltage pulse providing means (L) to the driver stage.

6. Circuit according to claim 3, further including a resistor (R) in the signal path (3) from the driver stage (1) to the output transistor ($T_2$) and connected between the protective circuit (2) and the output transistor;
and said means (L) providing the high-voltage pulse comprises an inductance (L) connected to the resistor at a terminal remote from the protective circuit (2).

7. Circuit according to claim 6, further including a capacitor (C) connected in circuit with the resistor and providing, together with the resistor, an R/C time delay circuit to delay application of the reverse polarity high-voltage pulse to the emitter-collector circuit of said controlled switch means transistor ($T_1$) to ensure conduction of said controlled switch means transistor ($T_1$) before application of said reverse polarity pulse thereto.

8. Circuit according to claim 1, further including a time delay circuit (R/C) connected between said means (L) providing the high-voltage pulse and the protective circuit (2) to ensure protective operation of said protective circuit in advance of application of said high-voltage reverse polarity pulse thereto.

9. Circuit according to claim 2, further including an R/C time delay circuit between the means (L) providing the high-voltage pulse and said controlled switch means ($T_1$) to ensure protective short-circuiting operation of said controlled switching means in advance of the application of the reverse polarity high-voltage pulse therethrough.

* * * * *